United States Patent [19]

Menna

[11] Patent Number: 5,551,977
[45] Date of Patent: Sep. 3, 1996

[54] SUSCEPTOR FOR EFG CRYSTAL GROWTH APPARATUS

[75] Inventor: Andrew A. Menna, Belmont, Mass.

[73] Assignee: ASE Americas, Inc., Billerica, Mass.

[21] Appl. No.: 339,357

[22] Filed: Nov. 14, 1994

[51] Int. Cl.$^6$ .................................................. C30B 35/00
[52] U.S. Cl. ........................... 117/209; 117/200; 117/900
[58] Field of Search ................................. 65/89; 117/16, 117/20, 21, 22, 24, 25, 200, 209, 211, 900; 264/164; 437/2

[56] References Cited

U.S. PATENT DOCUMENTS

| | | | |
|---|---|---|---|
| 4,647,437 | 3/1987 | Stormont et al. | 117/211 |
| 4,661,324 | 4/1987 | Sink et al. | 117/200 |
| 4,968,380 | 11/1990 | Freedman et al. | 117/16 |
| 5,037,622 | 8/1991 | Harvey et al. | 117/200 |
| 5,156,978 | 10/1992 | Bathey et al. | 437/2 |

Primary Examiner—Felisa C. Garrett
Attorney, Agent, or Firm—Pandiscio & Pandiscio

[57] ABSTRACT

An improved susceptor for a crucible/die assembly for growing tubular crystalline structures by the EFG process is provided. The crucible/die assembly comprises a die having a substantially polygonally-shaped top end surface for supporting a film of silicon feed material that is replenished from a melt in the crucible through capillary action. A hollow crystalline body is grown from the film of silicon material on the top end surface of the die. The heat susceptor is made of graphite or similar material, and has a peripheral configuration similar to that of the die. Further, the upper surface of the heat susceptor has a central land and a plurality of circumferentially-spaced upwardly extending projections. The central land thermally contacts a central portion of the lower surface of the crucible/die, and the projections thermally contact the lower surface of the crucible/die at its corners, whereby a temperature distribution is provided that permits growth of hollow bodies having more nearly constant thickness walls.

12 Claims, 4 Drawing Sheets

SUSCEPTOR FOR EFG CRYSTAL GROWTH APPARATUS

This invention was made under Department of Energy Subcontract No. NREL-ZM-2-11040-3.

FIELD OF THE INVENTION

This invention relates generally to apparatus for growing crystalline bodies from a melt by the EFG process. More particularly, the present invention relates to a novel heat susceptor for use in conjunction with the crucible/die assembly of an EFG crystal growth apparatus.

SUMMARY OF THE PRIOR ART

In the edge-defined, film-fed, crystal growth technique (the EFG process), tubular polygonally-shaped crystalline bodies are grown on a seed from a liquid film of feed material located on the top surface of the die portion of a crucible/die assembly. The polygonally-shaped, hollow bodies are longitudinally subdivided at their corners into a plurality of elongate, flat elements. These flat elements are then further subdivided to form substrates for use in the creation of photovoltaic cells.

The feed material (typically silicon) is contained in a molten state in the crucible portion of the crucible/die assembly. From this crucible portion, the feed material is transported by capillary action through one or more capillaries to the top surface of the die portion.

Heat is provided to the crucible/die assembly to maintain the feed material in a molten state by an RF coil heater which is located in spaced, surrounding relation to the crucible/die assembly. Electromagnetic energy generated by the coil is absorbed by the crucible/die assembly, thereby heating it. Further, a heat susceptor is located in thermally conductive contact with the lower surface of the crucible/die assembly.

Usually the upper surface of the heat susceptor has the same area and shape as the lower surface of the crucible/die assembly and is aligned with the lower surface of the crucible/die assembly. Heretofore, the preferred susceptor design has a centrally-located upwardly-extending annular hub section that serves as a support for the crucible/die assembly. The center hub section is arranged so that the crucible-die assembly, except for the area of the central hub section, is isolated from the susceptor by an air gap in the order of 0.045 inch, the gap being provided so as to allow more heat transfer to the center of the crucible/die assembly in order to insure complete melting of the silicon that is fed to the crucible.

Unfortunately, however, it has been found that the walls of polygonal tubes formed by conventional EFG apparatus using hub-type susceptors are thicker at their corners than in the regions between those corners. These thick wall portions cause difficulty in processing the resulting substrates into acceptable photovoltaic cells.

OBJECTS OF THE INVENTION

Accordingly, it is an object of the present invention to provide an improved apparatus for growing tubular, crystalline bodies by the EFG process.

It is also an object of the present invention to provide an improved susceptor for use in EFG crystalline tube growth apparatus.

Another object of the present invention is to provide an apparatus for growing tubular, crystalline bodies by the EFG process which permits growth of bodies with a polygonal cross-sectional configuration that are characterized by walls which have a substantially uniform thickness.

SUMMARY OF THE INVENTION

The accomplishment of these and other objects of the invention has been made possible by the discovery that in conventional EFG crystalline tube growth apparatus designed to grow hollow polygonally-shaped crystalline bodies, using a susceptor with a central hub as described above, the temperature is lower at the corners of the top surface of its polygonally-shaped die portion than it is along the portions of that surface located between the respective corners. That temperature differential accounts for the hollow polygonal crystalline bodies being thicker at their corners. That variance in temperature occurs despite the fact that the corners of the polygonally-shaped top surface of the die extend closest to the RF coil.

The present invention solves the foregoing problem by providing an improved heat susceptor that comprises a graphite body having an upper polygonally-shaped surface which substantially corresponds in shape to the bottom of the crucible/die assembly and is characterized by a raised center land and an upwardly-projecting land or tab at each corner. The upper surfaces of the tabs and the center land are located in the same plane. Further, an opening extends through the center hub section of the susceptor body to permit passage of replenishment melt material to the crucible/die assembly.

In the preferred embodiment of the invention, the improved heat susceptor is an integral structure machined from a single piece of graphite, and the raised center land and the corner tabs of the heat susceptor are in direct thermal contact with the lower surface of the crucible/die assembly. The remaining portions of the upper surface of the improved heat susceptor body are spaced from the lower surface of the crucible/die in the same manner as the prior known susceptor. The improved heat susceptor provides heat flux through the crucible/die assembly at the center sufficient to assure melting of the source material in the crucible and also at the corners of the crucible/die assembly sufficient to assure growth of hollow polygonal bodies with corner thicknesses that are substantially the same as the wall thicknesses.

Additionally, it is preferred that the corner tabs be generally triangular, since such shape appears to best reduce thickness variations in the walls of the tubular structures grown by the EFG process.

BRIEF DESCRIPTION OF THE DRAWINGS

These and other features and advantages of the present invention will become apparent to those skilled in the art from the following detailed description of a preferred embodiment of the invention in view of the appended drawings, wherein like reference numbers are used to refer to like elements throughout, and wherein.

DETAILED DESCRIPTION OF PREFERRED EMBODIMENT

Figure 1:
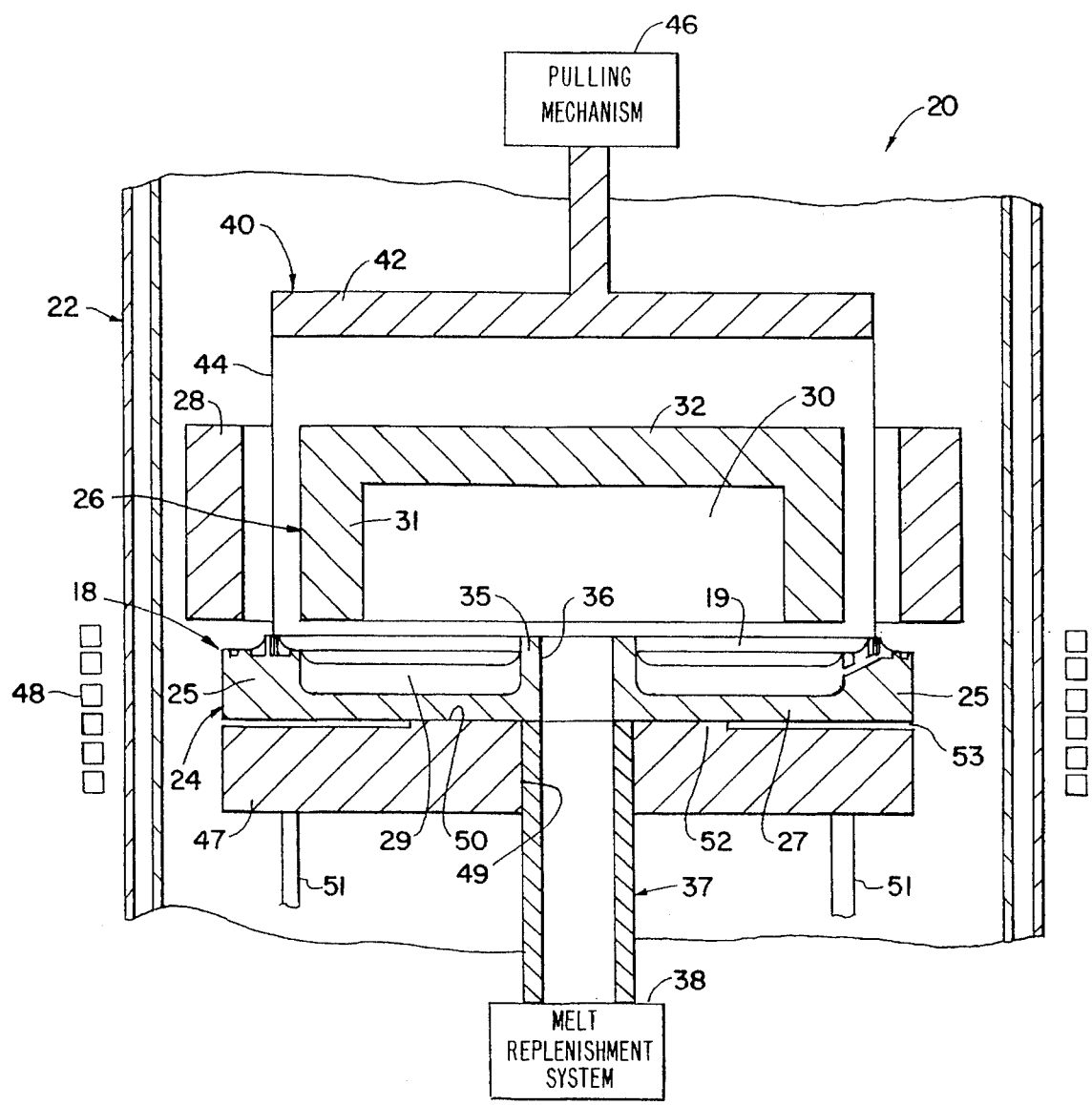
FIG. 1 is an illustrative, front elevational view, partially in section, of a conventional EFG crystal growth apparatus.

Referring now to the drawings, and particularly to FIG. 1, a conventional EFG crystal growth apparatus 20 is shown. Apparatus 20 includes a furnace enclosure, generally indicated at 22, within which is disposed a crucible/die assembly 18 and inner and outer after-heaters 26 and 28. Crucible/die assembly 18 comprises a crucible 24 having an upstanding sidewall 25 and a bottom wall 27 which define the space 29 in which a silicon melt is contained. The crucible/die assembly includes a capillary die 19 formed integrally with the upper end of sidewall 25. Preferably the crucible/die assembly is made according to the teachings of U.S. Pat. No. 5,037,622 issued to David S. Harvey et al. Alternatively, it may be made according to U.S. Pat. No. 4,647,437 issued to R. W. Stormont et al.

Inner after-heater 26 is hollow and defines an inner space 30. Preferably, inner after-heater 26 is a tubular member with a cylindrical or polygonal cross-sectional configuration. Inner after-heater 26 comprises a side wall 31 and a top end wall 32. The bottom end of inner after-heater 26 is open so that the interior 30 of inner after-heater 26 communicates with the interior of crucible 24. The inner after-heater is supported by a radiation shield (not shown) that is attached to the upper end of the crucible/die assembly, e.g., as shown in U.S. Pat. No. 5,156,978 issued to B. R. Bathey et al, and U.S. Pat. No. 4,544,528 issued to R. W. Stormont et al.

Crucible 24 additionally comprises a central hollow hub 35 having a center bore 36. Hub 35 is integrally attached to, and extends upwardly from bottom wall 27 of the crucible. Hub 35 extends above side wall 25 so as to project above the level of melt 29 in crucible 24. Typically, a hollow conduit 37 is connected to hub 35. Conduit 37 is coupled with a suitable melt replenishment system 38 that is adapted to deliver solid particles of feed stock through bore 36 into the region 30 above crucible 24. The particles of feed stock fall from this region into melt-containing space 29. By way of example, the melt replenishment system 38, which does not form a part of the present invention, might take the form of the chip thruster illustrated in U.S. Pat. No. 4,661,324 issued to Sink, et al. or an arrangement as disclosed in U.S. Pat. No. 4,968,380 issued to G. M. Freedman et al.

Apparatus 20 additionally comprises a seed assembly 40 that includes a seed holder 42 and a seed 44. Seed assembly 40 is attached to a pulling mechanism 46 which is adapted to move seed holder 42 axially toward and away from die 19.

Apparatus 20 further includes a heat susceptor 47, and a heating coil 48 surrounding enclosure 22 adjacent to crucible 24. Susceptor 47 is supported by suitable support members such as posts 51 that in turn are supported by another part of the furnace. Preferably heat susceptor 47 is a short body having a central opening 49 to accommodate conduit 37, and is positioned directly below and serves as a support for crucible/die assembly 18. Heat susceptor 47 has a substantially horizontal upper surface 50, and a raised hub portion 52 that extends upwardly from the central portion of upper surface 50. Hub portion 52 spaces the outer portion of upper surface 50 of heat susceptor 47 from crucible/die assembly 18 by distance of about 0.045 inches as representatively shown at 53. Heat susceptor 47 is made of graphite or other suitable material. Heat susceptor 47, like crucible/die assembly 18, is heated by the absorption of electromagnetic energy generated by heating coil 48. Susceptor 47 transmits heat to crucible 24 by conduction via hub 52 to the center of the crucible, so as to assure that the feed material in crucible 24 is kept in a molten state.

Figure 2:
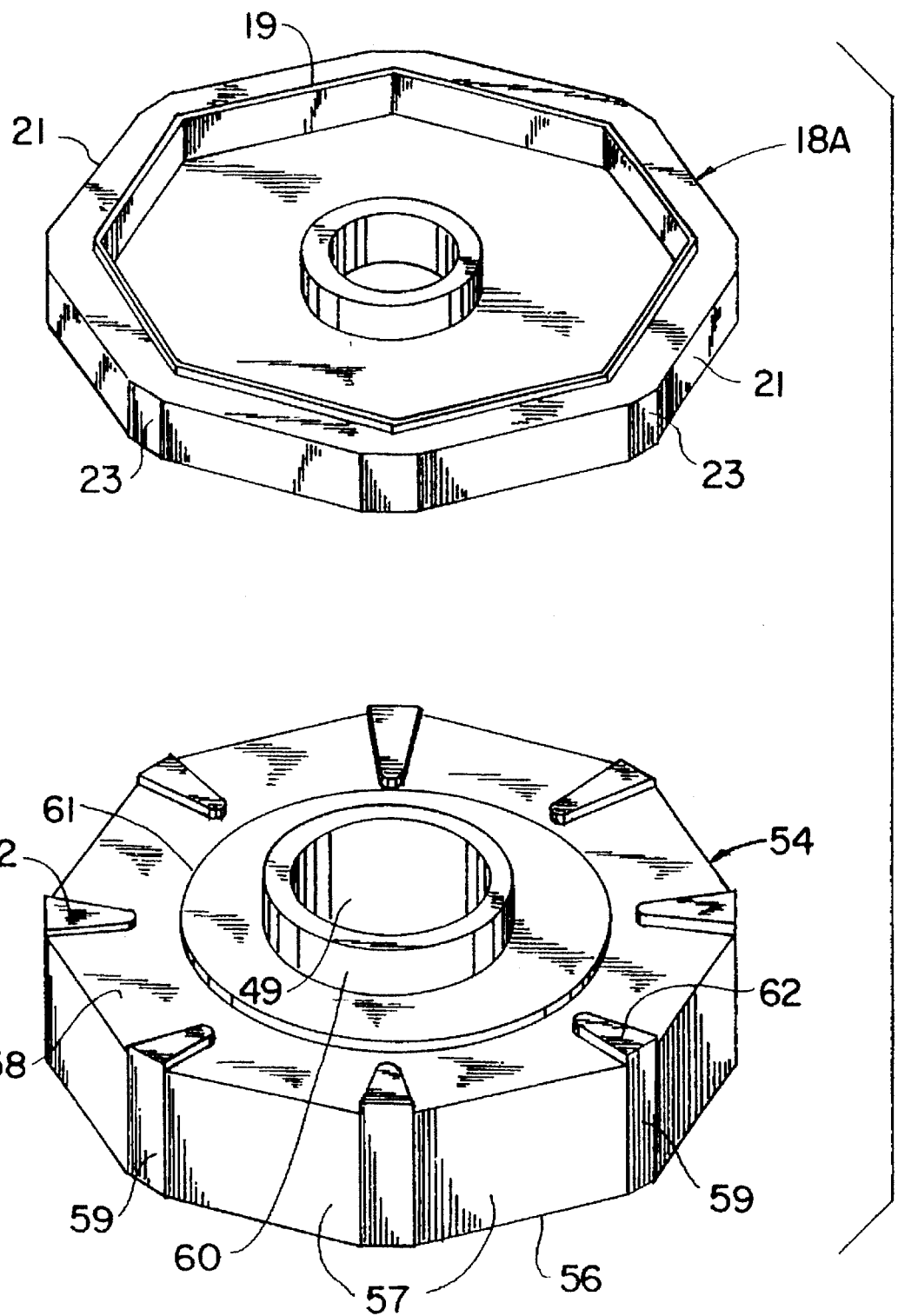
FIG. 2 is a perspective exploded view of a crucible/die assembly and an improved susceptor made in accordance with the present invention.
Figure 3:
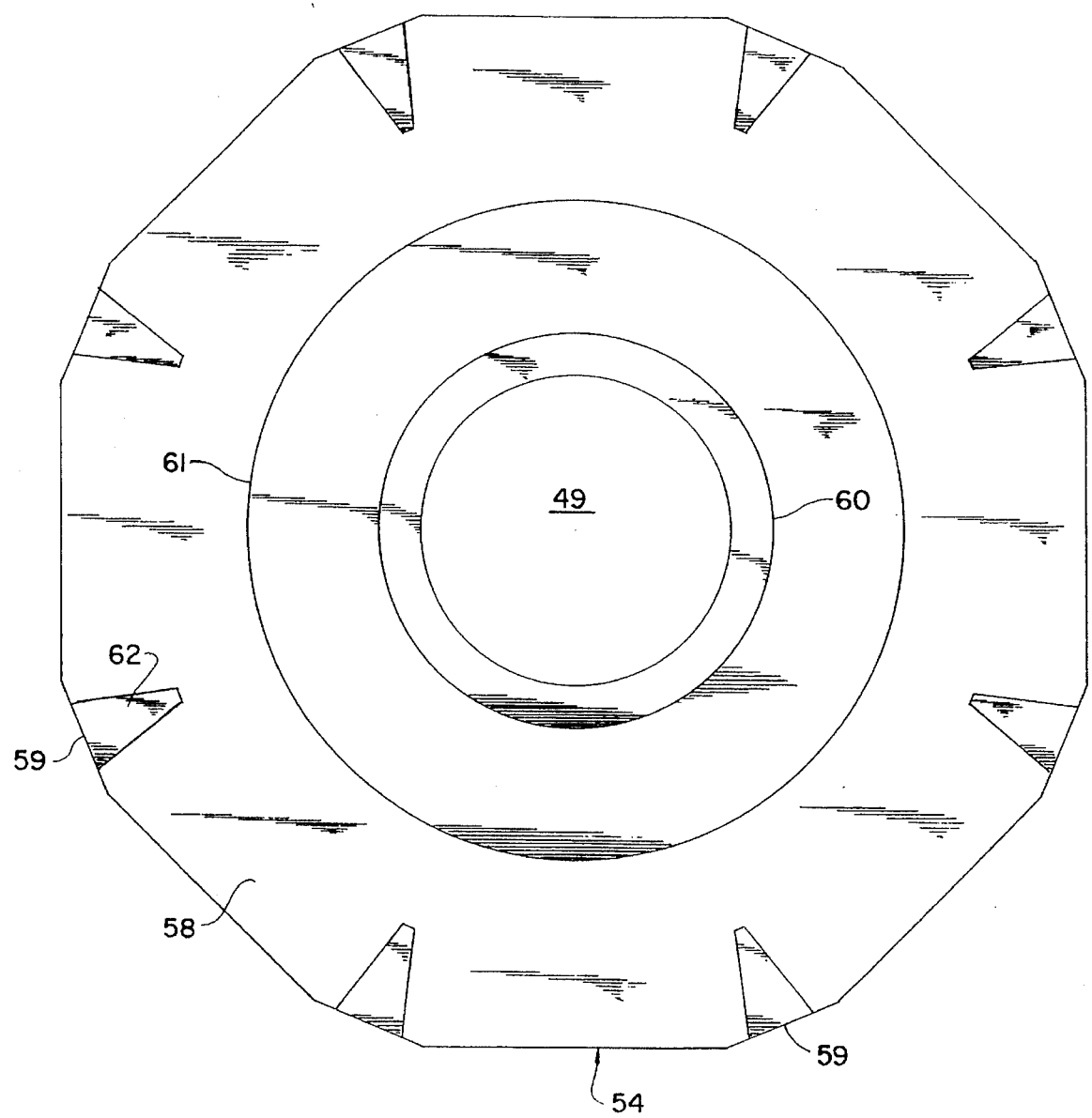
FIG. 3 is a plan view of the improved heat susceptor shown in FIG. 2.
Figure 4:
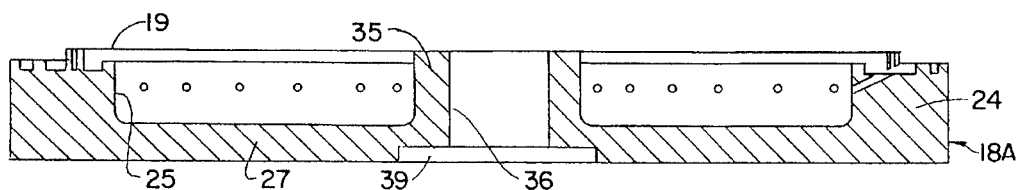
FIG. 4 is a sectional view in elevation of the crucible/die assembly shown in FIG. 2.

Turning now to FIGS. 2–4, it will be seen that the new heat susceptor 54 made in accordance with the present invention is similar to but differs from susceptor 47. In FIG 3, heat susceptor 54 includes a short body 56. FIGS 2 and 4 illustrate the associated crucible of the crucible/die assembly 18A and susceptor body 56 have similar polygonal shapes. The crucible and the susceptor have eight like side surfaces 21 and 57 respectivley that are bevelled at their corners so as to form narrow connecting corner surfaces 23 and 59 respectively. It is to be appreciated that the top end surface of die 19 of crucible/die assembly 18A also is a polygon constituting eight like sides or sections, but its corners are not bevelled. The upper surface 58 of susceptor body 56, corresponding to upper surface 50 of heat susceptor 47, has a hub portion consisting of a central hub 60 and a surrounding land portion 61, and a plurality of triangularly-shaped lands or raised tabs 62 projecting upwardly from upper surface 58 in circumferentially spaced relationship to one another. Tabs 62 are located at the periphery of upper surface 58. Further, each of the tabs 62 is disposed so that its center line coincides with a radial line extending from the axis of center hole 49 to the center of the corresponding corner surface 59 of the heat susceptor. Upper surface 58 defines a substantially regularly shaped polygonal area corresponding to the area defined by lower surface of a crucible/die assembly 18A.

The upper surfaces of center land portion 61 and tabs 62 respectively are located in the same horizontal plane, and coact to support crucible/die assembly 18, while hub 60 projects above the level of land portion 61 and fits in an annular depression 39 in the bottom of crucible/die assembly 18A that is coaxial with the center bore 36, whereby the crucible/die assembly is centered on the susceptor. The crucible/die assembly is positioned on the susceptor so that tabs 62 are in registration with the corner surfaces of the crucible/die assembly. Accordingly, pathways for the direct conductive transfer of heat from heat susceptor 54 to the areas of lower surface of the crucible/die assembly are provided by the projections or tabs 62, as well as by central hub 60. If desired, the susceptor (or the crucible portion of the crucible/die assembly) may be provided with one or more locating pins and the crucible/die assembly (or the susceptor) may be provided with mating cavities to receive the locating pins, with the locating pins and mating cavities being located so as to assure that the crucible/die assembly is positioned so that its corner surfaces 23 are in registration with the corresponding corner surfaces 59 of the susceptor.

The shape of tabs 62 may be varied. However, it has been empirically determined that tabs 62 may advantageously be generally triangular in shape.

Preferably, heat susceptor 54 is machined from a single block of graphite or other suitable material so that all of its above-described elements are formed integrally with one another. Other conventionally known methods of manufacturing a susceptor may be used.

Figure 5:
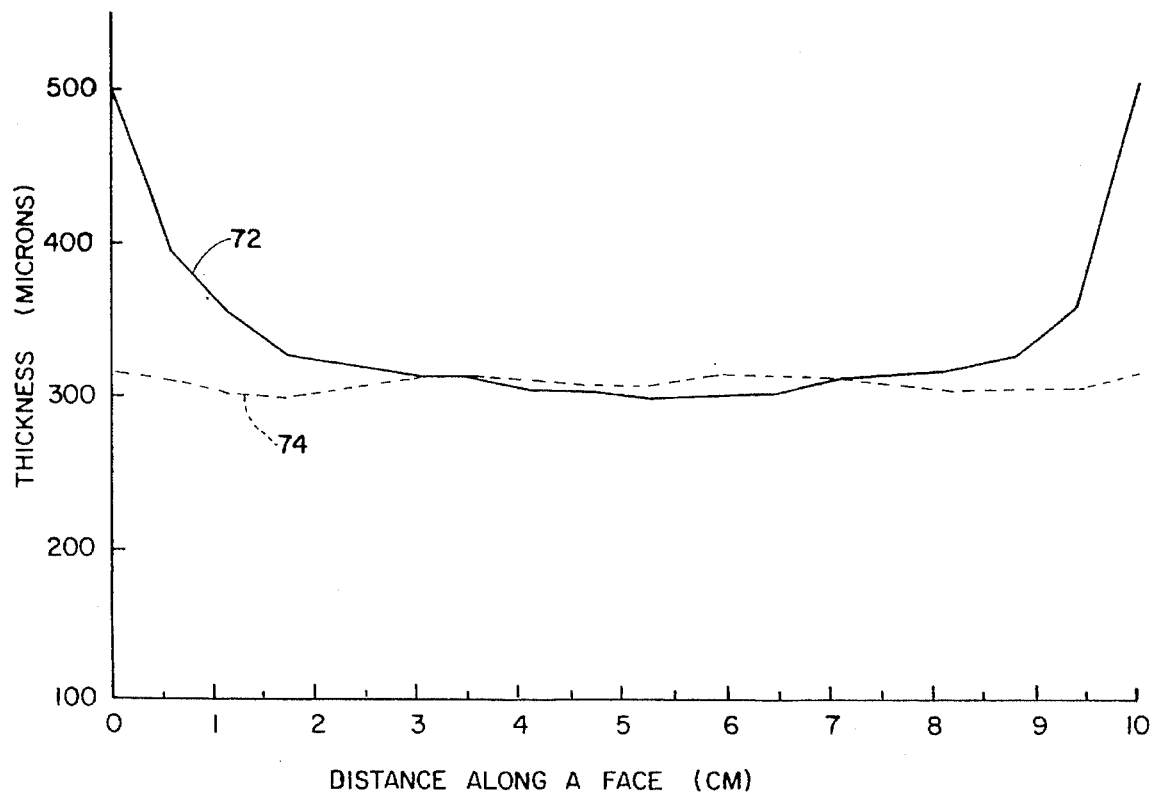
FIG. 5 is a comparative graphical representation showing in solid lines the transversely measured wall thickness between a pair of adjacent corners of a polygonally-shaped, tubular crystalline structure grown in a conventional EFG crystal growth apparatus, and in broken lines the corresponding transversely measured wall thickness of a polygonally-shaped, tubular crystalline structure grown in an EFG crystal growth apparatus utilizing an improved heat susceptor in accordance with the present invention.

FIG. 5 provides a graphical comparison of the variations in the wall thickness of polygonal hollow bodies between adjacent corners thereof when (1) a conventional prior art heat susceptor like that shown in FIG. 1 is used, as shown in solid lines 72, and (2) when a heat susceptor made in accordance with the present invention is used, as shown in dashed lines 74. In FIG. 5 the limits of the horizontal axis represent the edge-to-edge (corner-to-corner) width of each face of the polygonal hollow body. FIG. 5 clearly demonstrates that the non-uniform wall thickness resulting from the use of a conventional susceptor in the growth of hollow, polygonally-shaped tubular structures by the EFG process is substantially eliminated by the present invention.

Obviously the invention may take forms other than the preferred embodiment described above. Thus, for example, the die may be shaped to grow a polygon of n sides, where n is an integer having a value of at least three. Preferably n has a value of 8 or 9. Still other changes may be made without departing from the principles and spirit of the invention. Therefore, it is to be understood that the foregoing description has been presented by way of illustration and not limitation, and the invention is to be limited only by the terms of the claims appended hereto.

I claim:

1. In an apparatus for growing by the EFG process hollow crystalline bodies having a regular polygonally-shaped cross section, said apparatus including:

a longitudinal axis;

a crucible for containing a melt of a selected crystalline material, said crucible being centered on said longitudinal axis and having an outer side wall and a bottom wall defining an open-topped, melt containment volume;

a die formed integrally with said outer side wall of said crucible so as to form a crucible/die assembly, said die including an upwardly facing top end surface having a polygonal shape characterized by n sides and n corners formed by said n sides, where n is an integer having a value of at least three (3);

capillary means connecting said melt containment volume of said crucible to said top end surface of said die for transporting said melt material from said melt containment volume of said crucible to said top end surface of said die;

heating means for heating said crucible/die assembly such that at least the minimum temperature necessary for EFG process crystal growth from said melt material is established along the entirety of said top end surface of said die; and a heat susceptor centered on said longitudinal axis and underlying said crucible, said heat susceptor having an upper surface, a centrally located annular portion which projects upwardly from said upper surface and defines a land which thermally engages said bottom wall of said crucible, and a plurality of circumferentially spaced projections extending upwardly from said upper surface of said heat susceptor, each of said projections having an upper surface thermally engaging said bottom wall of said crucible, and each of said projections being in line with a corner of said top end surface of said die, whereby (a) heat is conducted to said melt containment volume by said land so as to maintain melt material located in said melt containment volume in a molten state and (b) additional heat is conducted by said projections to said crucible in line with the corners of said top end surface of said die so as to equalize the temperature along said top end surface of said die.

2. The apparatus according to claim 1 wherein said crucible/die assembly and said heat susceptor are formed of graphite.

3. The apparatus of claim 1 wherein each of said projections has a maximum transverse cross-section defined by a vertical projection of a portion of the periphery of said upper surface of said susceptor, and sides which converge inwardly toward said longitudinal axis of said apparatus.

4. The apparatus according to claim 1 wherein said bottom wall of said crucible and said upper surface of said heat susceptor define corresponding regular polygonally shaped areas that are geometrically and axially aligned with one another and also with said top end surface.

5. The apparatus of claim 4 wherein said regular polygonally shaped area defined by the top end surface of said die is an octagon.

6. The apparatus of claim 1 wherein each of said projections defines an area transverse to said longitudinal axis which is bisectable by a radius of said heat susceptor.

7. The apparatus of claim 1 wherein said crucible and said susceptor each have correspondingly shaped surface areas transverse to said longitudinal axis, n sides and n corners located at the junctions formed by each pair of said n sides, said corners of said crucible and said susceptor being beveled and said projections being in line with said beveled corners of said crucible and said susceptor.

8. The apparatus of claim 1 wherein said heating means includes a coil heater surrounding said crucible/die assembly.

9. The apparatus of claim 1 wherein said land and said upper surfaces of said projections are located in the same plane.

10. The apparatus of claim 9 wherein said plane is perpendicular to said longitudinal axis.

11. The apparatus of claim 1 wherein said crucible includes an inner side wall defining an axial passageway through said crucible, said heat susceptor defines an axial passageway extending therethrough, and said apparatus further comprises means for axially aligning said passageway through said crucible with said passageway through said heat susceptor.

12. The apparatus of claim 11 wherein said alignment means comprises an axially aligned, upwardly extending, annular recess in said bottom wall of said crucible and an axially aligned, upwardly extending, annular projection from said land of said heat susceptor, said annular recess and said annular projection being sized and located such that said annular projection is received in said annular recess.

* * * * *